(12) United States Patent
Otani et al.

(10) Patent No.: US 10,642,164 B2
(45) Date of Patent: May 5, 2020

(54) DEFECT DETECTION DEVICE AND DEFECT OBSERVATION DEVICE

(71) Applicant: HITACHI HIGH-TECHNOLOGIES CORPORATION, Minato-ku, Tokyo (JP)

(72) Inventors: Yuko Otani, Tokyo (JP); Kazuo Aoki, Tokyo (JP); Toshifumi Honda, Tokyo (JP); Nobuhiko Kanzaki, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 0 days.

(21) Appl. No.: 15/714,765

(22) Filed: Sep. 25, 2017

(65) Prior Publication Data

US 2018/0088469 A1 Mar. 29, 2018

(30) Foreign Application Priority Data

Sep. 26, 2016 (JP) .................................. 2016-186700

(51) Int. Cl.
*G03F 7/20* (2006.01)
*G01N 21/956* (2006.01)
*G01N 21/95* (2006.01)

(52) U.S. Cl.
CPC ....... *G03F 7/7065* (2013.01); *G01N 21/9501* (2013.01); *G01N 21/956* (2013.01); *G01N 21/95623* (2013.01); *G03F 7/70191* (2013.01); *G03F 7/702* (2013.01)

(58) Field of Classification Search
CPC .... G03F 7/7065; G03F 7/70191; G03F 7/702; G01N 21/95623; G01N 21/956; G01N 21/9501
See application file for complete search history.

(56) References Cited

U.S. PATENT DOCUMENTS

| 4,532,619 A * | 7/1985 | Sugiyama | G11B 7/127 369/106 |
| 9,279,774 B2 | 3/2016 | Romanovsky et al. | |
| 2002/0030807 A1* | 3/2002 | Maeda | G01N 21/956 356/237.2 |

(Continued)

FOREIGN PATENT DOCUMENTS

| JP | H06265895 A | 9/1994 |
| JP | 2006017743 A | 1/2006 |

(Continued)

OTHER PUBLICATIONS

Office Action dated Jan. 7, 2020 in corresponding Japanese Application No. 2016-186700

*Primary Examiner* — John W Lee
(74) *Attorney, Agent, or Firm* — Miles & Stockbridge, P.C.

(57) ABSTRACT

Provided is a defect detection device including an illumination unit including a condenser lens and a plurality of light beam synthesis units, and a detection unit detecting scattered light generated on a sample by the illumination unit. The condenser lens condenses a plurality of light beams, emitted onto the sample and having substantially the same wavelength and substantially the same polarization, on the sample. The plurality of light beam synthesis units bring the plurality of light beams close to each other and make the light beams have light paths parallel to the optical axis of the condenser lens.

8 Claims, 10 Drawing Sheets

(56) References Cited

U.S. PATENT DOCUMENTS

| | | | |
|---|---|---|---|
| 2004/0012844 A1* | 1/2004 | Ohtsuki | H01S 3/13013 359/341.1 |
| 2012/0274931 A1 | 11/2012 | Otani et al. | |
| 2013/0016346 A1 | 1/2013 | Romanovsky et al. | |
| 2017/0082425 A1* | 3/2017 | Minekawa | G01B 11/30 |

FOREIGN PATENT DOCUMENTS

| | | |
|---|---|---|
| JP | 2011-106974 A | 6/2011 |
| JP | 2014524033 A | 9/2014 |
| WO | 2013009757 A1 | 1/2013 |

\* cited by examiner

DEFECT DETECTION DEVICE AND DEFECT OBSERVATION DEVICE

BACKGROUND OF THE INVENTION

Field of the Invention

The present invention relates to a defect detection device and a defect observation device.

Background Art

In a process of manufacturing a semiconductor device, foreign substances and a pattern defect (hereinafter, foreign substances and a pattern defect will be referred to as a defect), such as a short circuit and disconnection, which are present on a wafer being a semiconductor substrate result in a failure such as an insulation failure of a wiring and a short-circuit. These defects are mixed due to various causes resulting from a manufacturing process, and thus the detection of the defects occurring during the manufacturing process at an early stage, the ascertainment of the source of occurrence of the defects, and the prevention of deterioration of a yield are important in the mass production of the semiconductor device.

A description will be given of a method of specifying the cause of occurrence of a defect which has been widely applied. First, the position of a defect on a wafer is specified by a defect inspection device, the defect is observed in detail and sorted by a scanning electron microscope (SEM) or the like on the basis of the coordinate information thereof, and comparison with a database is performed, thereby estimating the cause of occurrence of the defect.

However, there is a divergence between a coordinate system of the SEM and a coordinate system of the other inspection device, and thus a method of inspecting a defect, detected by the other inspection device, again using an optical microscope mounted on the SEM, correcting coordinate information, and observing the defect in detail on the basis of the corrected coordinate information is used. Thereby, it is possible to maintain a high throughput by correcting the divergence between the coordinate systems and improving the possibility of success in the observation of the defect.

As the related art, for example, JP-A-2011-106974 is known. JP-A-2011-106974 discloses a defect observation device that includes an optical microscope including a pupil filter selectively transmitting defective scattered light on a pupil surface of a detection optical system for the high-sensitivity detection of a defect, and an electron microscope.

SUMMARY OF THE INVENTION

A pattern formed on a wafer becomes finer as a semiconductor device becomes highly integrated, and a defect which is fatal to the semiconductor device has also become smaller and finer. With the miniaturization of a defect, the amount of reflected light and scattered light which are generated from the defect are reduced, and the defect is buried in the scattered light or the like which is generated due to the noise of a circuit or the surface roughness of the wafer, which leads to a concern that the detection of the defect by an optical microscope may not be successful.

For this reason, it is necessary to increase the amount of defective scattered light. As a method of increasing the amount of defective scattered light, a plurality of light sources are used. However, the scattered light from the defect, the scattered light from the surface roughness of the wafer, and the pupil filter have dependence on the wavelength of illumination, polarized light, and an incidence direction. For this reason, in a case where there is a difference in the incidence direction of illumination between a plurality of light beams, defect detection sensitivity is deteriorated.

Consequently, the invention is contrived in order to solve the above-described problem of the related art, and an object thereof is to provide a defect detection device capable of detecting a defect by using a plurality of light beams without deteriorating defect detection sensitivity in spite of having dependence on the wavelength of illumination, polarized light, and an incidence direction, and a defect observation device.

According to an aspect of the present invention, there is provided a defect detection device including an illumination unit that includes a condenser lens and a plurality of light beam synthesis units, the condenser lens condensing a plurality of light beams, emitted onto a sample and having substantially the same wavelength and substantially the same polarization, on the sample, and the plurality of light beam synthesis units bringing the plurality of light beams into close to each other and making the light beams have light paths parallel to an optical axis of the condenser lens, and a detection unit that detects scattered light generated on the sample by the illumination unit.

According to another aspect of the present invention, there is provided a defect observation device including the defect detection device and a control unit that acquires an image based on scattered light detected by the detection unit of the defect detection device and calculates coordinates of a defect on the basis of the acquired image, in which the illumination unit of the defect detection device is disposed outside a pupil of the detection unit.

According to the invention, it is possible to detect a defect by using a plurality of light beams without deteriorating defect detection sensitivity in spite of having dependence on the wavelength of illumination, polarized light, and an incidence direction.

DETAILED DESCRIPTION OF THE INVENTION

Hereinafter, an embodiment of the invention will be described in detail with reference to the accompanying drawings.

First Embodiment

Figure 1:
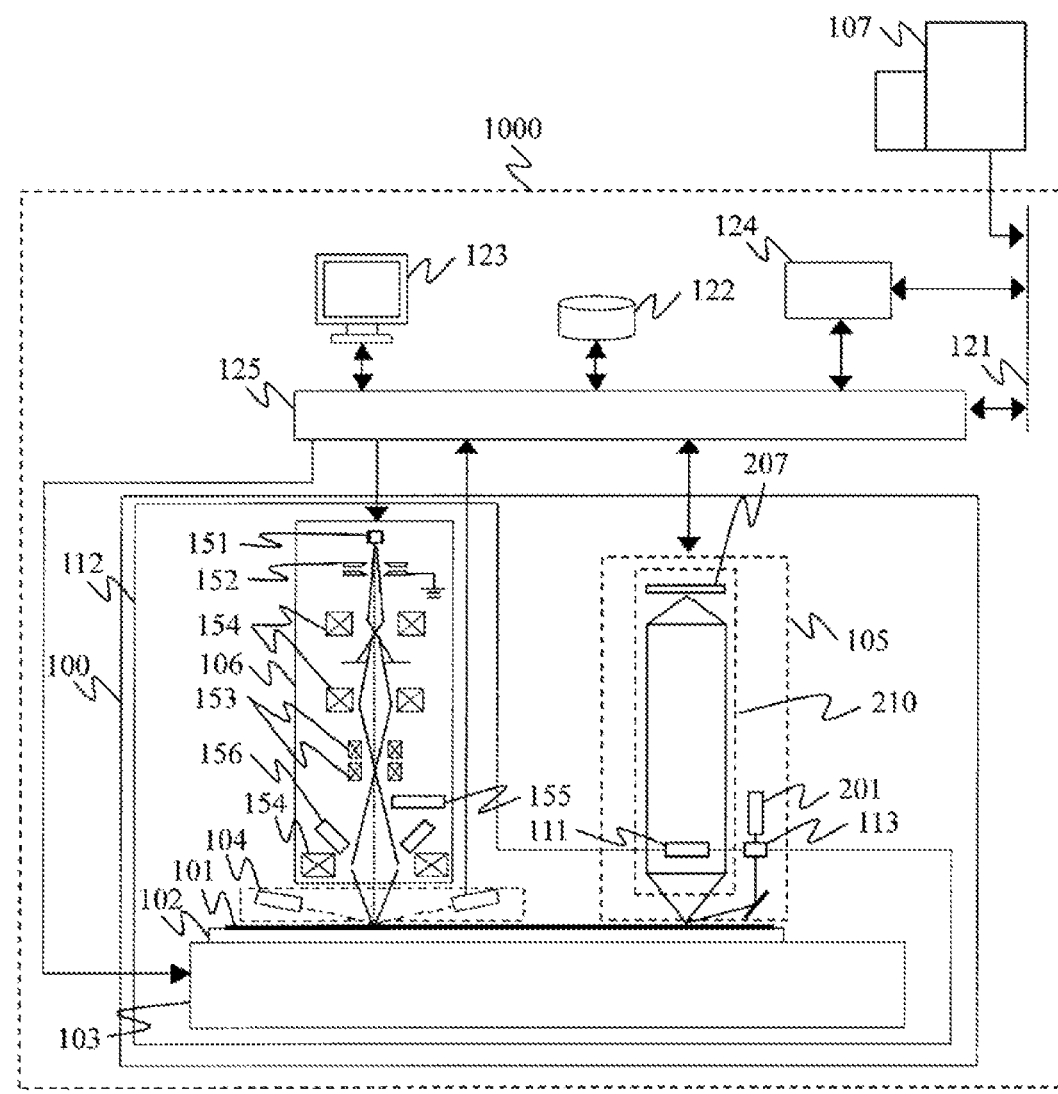
FIG. 1 is a block diagram illustrating the entire configuration of a defect observation device in a first embodiment of the invention.

First, a first embodiment of the invention will be described with reference to FIGS. 1 to 4. FIG. 1 is a block diagram illustrating the entire configuration of a defect observation device in a first embodiment of the invention.

A defect observation device 1000 is schematically constituted by a review device 100, a network 121, a database 122, a user interface 123, a storage device 124, and a control system unit 125. In addition, the defect observation device 1000 is connected to a defect inspection device 107 which is another inspection device through the network 121.

The defect inspection device 107 detects a defect which is present on a sample 101 and acquires defect information such as position coordinates and size of the defect. The defect inspection device 107 may be a device capable of acquiring information regarding the defect on the sample 101.

The defect information acquired by the defect inspection device 107 is input to the storage device 124 or the control system unit 125 through the network 121. The storage device 124 stores the defect information acquired by the defect inspection device 107 which is input through the network 121. The control system unit 125 reads the defect information which is input from the defect inspection device 107 or the defect information which is stored in the storage device 124, and controls the review device 100 on the basis of the read defect information. The control system unit observes some or all of the defects detected by the defect inspection device 107 in detail, and performs the sorting of the defects, the analysis of the cause of occurrence of the defects, and the like.

Next, a configuration of the review device 100 illustrated in FIG. 1 will be described.

The review device 100 is configured to include a driving unit including a sample holder 102 and a stage 103, an optical height detection unit 104, an optical microscope unit 105, a vacuum chamber 112, an SEM 106 (electron microscope unit), and a laser displacement meter (not shown).

The sample 101 is mounted on the sample holder 102 installed in the stage 103 which is movable. The stage 103 moves the sample 101 mounted on the sample holder 102 between the optical microscope 105 and the SEM 106. A defect to be observed which is present on the sample 101 can be positioned within a visual field of the SEM 106 or within a visual field of the optical microscope 105 by the movement of the stage 103.

The control system unit 125 is connected to the stage 103, the optical height detection unit 104, the optical microscope unit 105, the SEM 106, the user interface 123, the database unit 122, and the storage device 124. With such a configuration, operations and input and output of the respective components, such as the movement of the stage 103, the modulation of an illumination state, a lens configuration, and image acquisition conditions of the optical microscope unit 105, the acquisition and acquisition conditions of an image by the electron microscope unit 106, and measurement and measurement conditions by the optical height detection unit 104. In addition, the control system 125 is connected to a high-level system (for example, the defect inspection device 107) through the network 121.

The optical height detection unit 104 measures a value based on the displacement of a region surface to be observed. The term "displacement" as used herein includes various parameters such as the position of the region to be observed and the amplitude, frequency, and cycle of vibration. Specifically, the optical height detection unit 104 measures the height position of the region surface to be observed of the sample 101 which is present on the stage 103 and vibration in a vertical direction based on the region surface to be observed. The displacement and vibration measured by the optical height detection unit 104 are output to the control system 125 as signals, and are fed back to a movement sequence of the stage 103.

Next, a configuration of the optical microscope 105 will be described with reference to FIG. 2.

The optical microscope 105 includes a dark field illumination optical system 201, a bright field illumination optical system 211, and a detection optical system 210. In FIG. 2, the vacuum chamber 112 and the vacuum sealing windows 111 and 113 are not shown.

Figure 2:
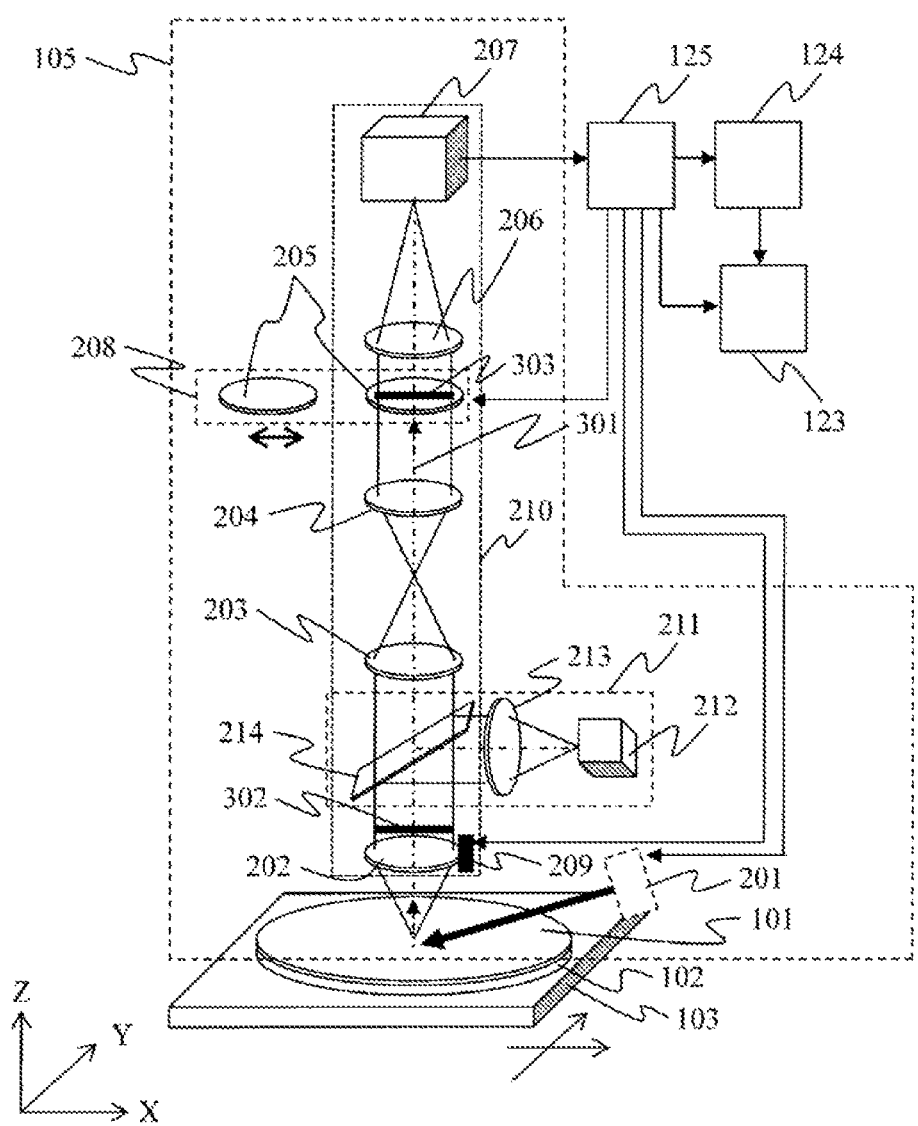
FIG. 2 is a schematic diagram illustrating a configuration of an optical microscope unit of the defect observation device in the first embodiment of the invention.

The bright field illumination optical system 211 is configured to include a white light source 212, an illumination lens 213, a half mirror 214, and an objective lens 202 as illustrated in FIG. 2. White illumination light emitted from the white light source 212 is converted into parallel light by the illumination lens 213. Regarding the parallel light, a half of incident light is folded in a direction parallel to the optical axis of the detection optical system 210 by the half mirror 214, and is condensed and emitted onto a region to be observed by the objective lens 202. Regarding the half mirror 214, a dichroic mirror capable of transmitting scattered light generated from the surface of the sample 101 toward the detector 207 by illumination from the dark field illumination optical system 201 may be used. In addition, a configuration may also be adopted in which the half mirror 214 is detached from the optical axis 301 in a case where the bright field illumination system 211 is not used in order to make a larger amount of scattered light, generated from the surface of the sample 101 by illumination from the dark field illumination optical system 201, reach the detector 207.

The detection optical system 210 includes the objective lens 202, lens systems 203 and 204, a spatial distribution optical element 205, an image forming lens 206, and a detector 207 as illustrated in FIG. 2. The reflected and scattered light generated from the region to be illuminated on the sample 101 by illumination emitted from the dark field illumination optical system 201 or the bright field illumination optical system 211 is collected by the objective lens 202, and is imaged on the detector 207 through the lens systems 203 and 204 and the image forming lens 206. The imaged light is converted into an electrical signal by the detector 207 and is output to the control system unit 125. The signal processed by the control system unit 125 is stored in the storage device 124. In addition, a processing result stored is displayed through the user interface 123.

The spatial distribution optical element 205 is disposed on a pupil surface 302 of the detection optical system 210 or a pupil surface 303 imaged by the lens systems 203 and 204. The spatial distribution optical element has functions of shielding light through masking, controlling a polarization direction of transmitted light, and selecting transmitted light, with respect to the light collected by the objective lens 202. For example, the spatial distribution optical element 205 is a filter that transmits only polarized light in an X-axis direction, a filter that transmits only polarized light in a Y-axis direction, a filter that transmits only polarized light vibrating in a radial direction centering on the optical axis 301, or the like.

In addition, a filter masked so as to cut scattered light generated due to surface roughness of the sample 101, or a filter in which a transmission polarization direction is controlled so as to cut scattered light generated due to surface roughness of the sample 101 may be used. The spatial distribution optical element 205 suitable for the detection of a target defect, among a plurality of spatial distribution optical elements 205 having different optical characteristics, is disposed on the optical axis 301 of the detection optical system 210 by the switching mechanism 208.

The spatial distribution optical element 205 may not be necessarily disposed on the optical axis 301. In this case, a dummy substrate that changes the same length of a light path as that of the spatial distribution optical element 205 is disposed on the optical axis 301. The switching mechanism 208 can perform switching between the spatial distribution optical element 205 and the dummy substrate. For example, in a case where bright field observation is performed or a case where there is no optical element 205 suitable as an object to be observed, there is a concern that an image acquired by the detector 207 may be disturbed by the optical element 205. For this reason, in a case where the optical element 205 is not used, the dummy substrate may be disposed on the optical axis 301.

FIG. 3 illustrates an example of the spatial distribution polarizing element 205 as a pupil filter which is disposed on the pupil surface 303 illustrated in FIG. 2. FIGS. 3A to 3H illustrate pupil filters 225A to 225H having different shapes.

In FIGS. 3A to 3H, a white portion 343 indicates a transmission portion, a black portion 342 indicates a light shielding portion, and a polarizer portion 234 indicates a polarizer portion that transmits light in a selected polarization direction. The polarizer portion 234 divides a region, and may be a transmission polarization axis which is different for each region. The diameter of each of the pupil filters 225A to 225H may be equal to or greater than the diameter of the pupil, and the pupil filters 225A to 225H are disposed such that the center of each of the pupil filters 225A to 225H is consistent with the optical axis 301 of the detection optical system 210 of FIG. 2.

Figure 3A:
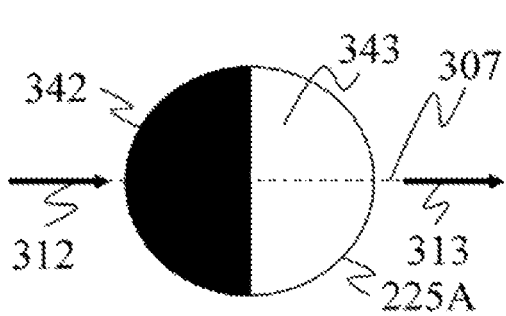
FIGS. 3A to 3H illustrate an example of a filter disposed on a detection system pupil surface of an optical microscope unit in the first embodiment of the invention.
Figure 3E:
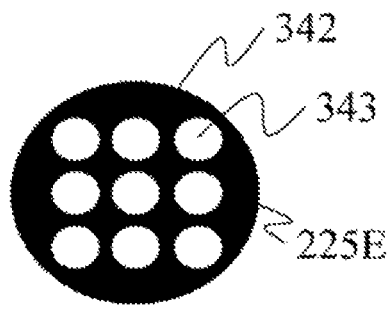

The pupil filter 225A illustrated in FIG. 3A is a filter having an end of the light shielding portion 342 which is substantially at a right angle to the incidence direction 312 of the dark field illumination optical system 201, and is configured to shade a portion on an incidence side within the pupil.

Figure 3B:
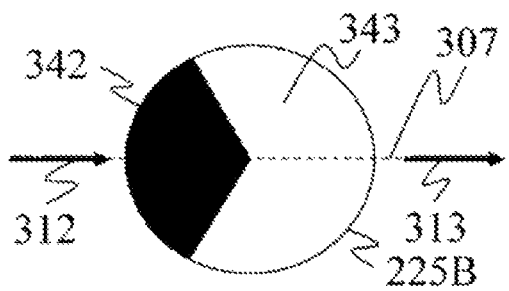
Figure 3F:
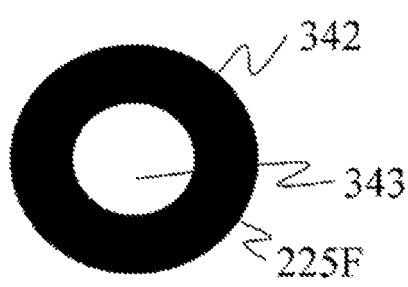

The pupil filter 225B illustrated in FIG. 3B is a filter having the light shielding portion 342 that shades a fan-shaped region within the pupil. The pupil filter 225B of FIG. 3B makes the fan-shaped vertex of the light shielding portion 342 conform to the center (the optical axis 301 of the detection optical system 210 of FIG. 2) of the pupil surface 303.

Figure 3C:
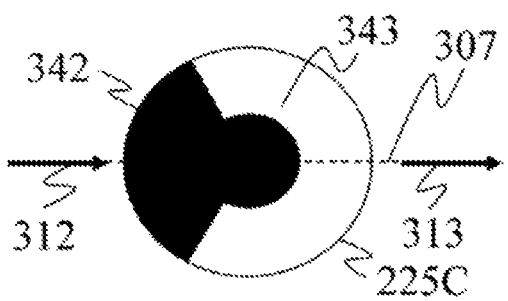
Figure 3G:
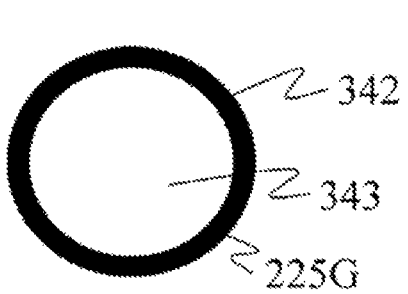

In addition, the pupil filter 225C illustrated in FIG. 3C is a filter having the light shielding portion 342 in which a fan-shaped light shielding portion shielding rear scattering within the pupil and a light shielding portion shielding upper scattering conform to each other.

Figure 3D:
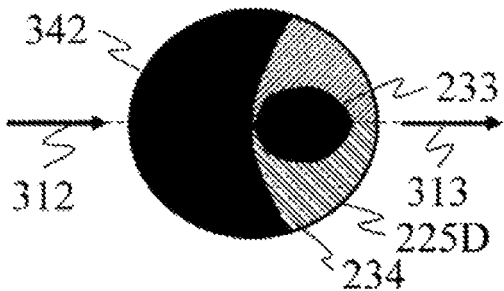
Figure 3H:
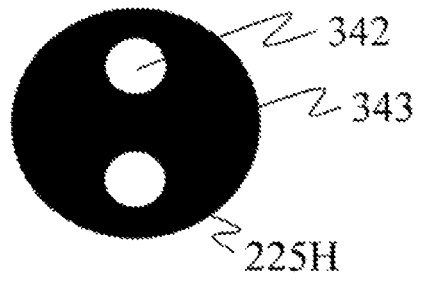

In addition, the pupil filter 225D illustrated in FIG. 3D is a pupil filter having the light shielding portion 342, the light shielding portion 233, and the polarizer portion 234 that transmits only light polarized in a certain direction.

The pupil filters 225A, 225B, 225C, and 225D illustrated in FIGS. 3A to 3D are examples of a pupil filter that shields scattered light generated due to fine irregularities of the surface of the sample 101 (wafer to be inspected) when P polarized light is incident at a low incident angle.

Here, a light shielding plate such as a metal plate having been subjected to black delustering surface treatment, a combination of a polarizing element and a wavelength plate, a combination of a polarizing element and liquid crystal, or a digital mirror array is used for the light shielding portion 342 of the pupil filter disposed on the pupil surface 303.

Meanwhile, the distribution of intensities of scattered light varies depending on optical properties such as the sample 101 and the shape, size, and refractive index of a fine foreign substance or fine defect to be detected, and thus optical characteristics of the pupil filter disposed on the pupil surface 303 of the detection optical system 210 are not limited to the shapes illustrated in FIGS. 3A to 3D. The pupil filter may have such a shape that components of scattered light due to fine irregularities of the surface of a wafer to be inspected are shaded in accordance with distribution characteristics of the scattered light.

Next, FIGS. 3E to 3H illustrate examples of the shapes of spatial masks 225E to 225H disposed in the vicinity of the pupil surface 303 of FIG. 2 for the purpose of removing scattered light caused by a pattern.

In the examples of the respective spatial masks 225E to 225H illustrated in FIGS. 3E to 3H, the spatial masks are disposed on or in the vicinity of the pupil surface 303, the light shielding portion 342 indicates a mask portion, and the transmission portion 343 indicates an opening portion. Here, an example (FIG. 3E) in which nine small openings 343 are provided in the central portion, an example (FIG. 3F) in which a middle-sized opening 343 is provided in the central portion, an example (FIG. 3G) in which a large opening 343 is provided in the central portion, and an example (FIG. 3H) in which two small openings 342 are provided are shown, but the invention is not limited thereto. A longitudinal or lateral striped opening may be provided, and the number of openings and the shape and size thereof can be appropriately set.

Meanwhile, an image on the pupil surface 303 represents the diffraction of an object to be inspected and scattering angle components of scattered light, and thus it is possible to perform the diffraction of an object to be inspected and the selection of scattered light by determining the position and size of an opening to be provided.

The distribution of scattered light from surface roughness and a target defect depends on the wavelength, polarization, and an incidence direction (an incident angle and an incident azimuth angle) of illumination, and thus optical characteristics of the appropriate spatial distribution optical element (pupil filter) 205 also depend on the wavelength, polarization, and an incidence direction of illumination.

The height control mechanism 209 is used to make the surface of an object to be observed on the sample 101 and a focusing position of the detection optical system 210 conform to each other in response to an instruction from the control system 125. Examples of the height control mechanism 209 include a linear stage, an ultrasonic motor, a piezo stage, and the like.

Examples of the detector 207 include a two-dimensional CCD sensor, a linear CCD sensor, a TDI sensor group in which a plurality of TDIs are disposed in parallel, a photodiode array, and the like. In addition, the detector 207 is disposed such that the sensor surface of the detector 207 conjugates with the surface of the sample 101 or the pupil surface 302 of the objective lens.

Figure 4:
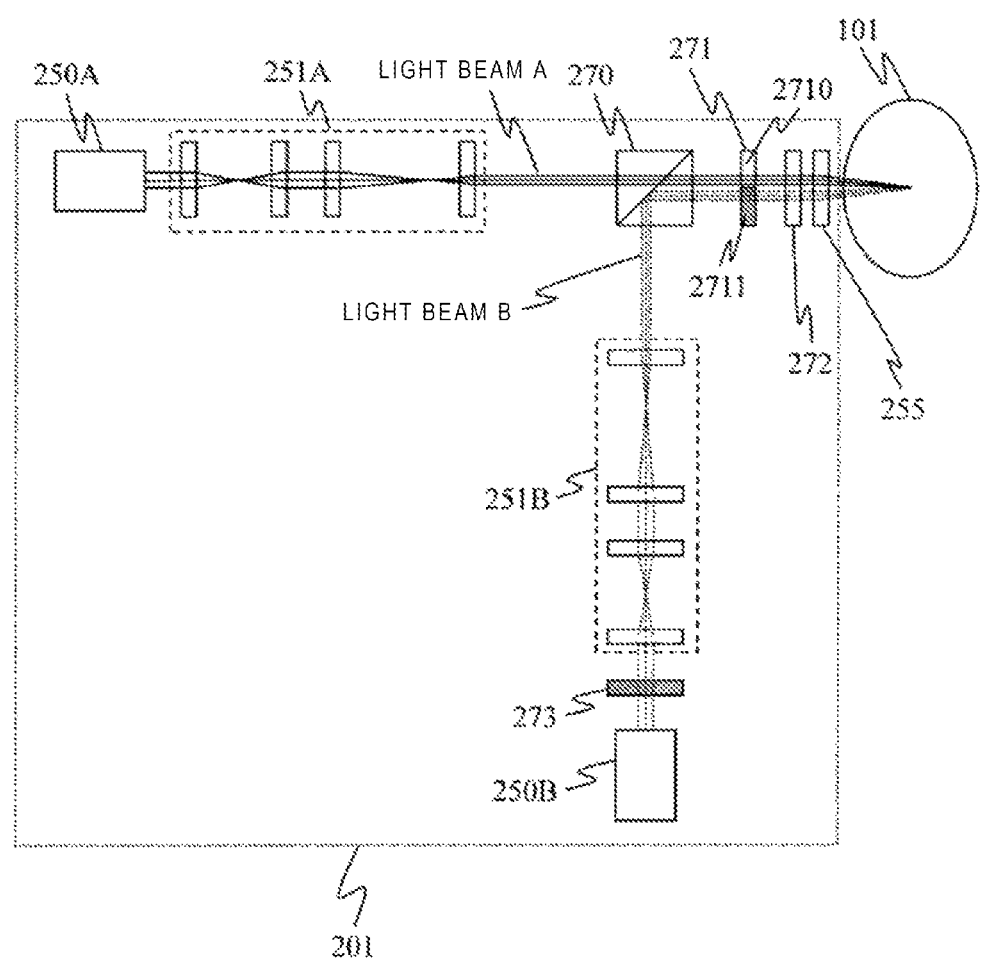
FIG. 4 is a schematic diagram illustrating an illumination system of the optical microscope unit in the first embodiment of the invention.

Here, FIG. 4 illustrates a schematic configuration of the dark field illumination optical system 201 according to the first embodiment of the invention.

In the embodiment of the invention, an illumination unit (dark field illumination optical system 201) includes a condenser lens 255 and a plurality of light beams synthesis units (270, 273). The condenser lens 255 condenses a plurality of light beams (light beam A, light beam B), emitted onto the sample 101 and having substantially the same wavelength and substantially the same polarization, on the sample 101. The light beam synthesis units bring the plurality of light beams (light beam A, light beam B) close to each other and make the light beams have light paths parallel to the optical axis of the condenser lens 255. Scattered light generated on the sample 101 by the illumination unit (dark field illumination optical system 201) is detected by the detector 207 illustrated in FIG. 2.

Specifically, the dark field illumination optical system 201 includes light sources 250A and 250B, beam forming optical systems 251A and 251B, a PBS 270, a combination wavelength plate 271, a polarizer 272, a ½ wavelength plate 273, and the condenser lens 255. The combination wavelength plate 271 is constituted by a ½ wavelength plate portion and a dummy portion that does not have a phase modulation function. The light sources 250A and 250B are lasers having substantially the same wavelength and substantially the same polarization. The PBS 270, the ½ wavelength plate 273, the combination wavelength plate 271, and the pupil filter have dependence on a wavelength, and thus it is preferable that a difference in wavelength between light beams is equal to or less than 1% of the wavelength. FIG. 4 illustrates an example in which a polarization direction of light emitted by the light sources 250A and 250B is P polarized light with respect to the PBS 270 and the sample 101 is irradiated with P polarized light. However, this embodiment is not limited thereto.

The light beam A emitted from the light source 250A is converted into parallel light having a circular or elliptical beam diameter with an appropriate size through a beam forming optical system 251A. The light beam A is P polarized light, and thus passes through the PBS 270, passes through a dummy portion 2710 of the wavelength plate 271 and the polarizer 272, and is condensed on the sample 101 through the condenser lens 255 to light up.

On the other hand, the light source 250B is disposed so as to be emitted in the same polarization direction as that of the light source 250A, and the light beam B emitted from the light source 250B is converted into a polarization direction rotated by 90 degrees by the ½ wavelength plate 273. Next, the light beam B is converted into parallel light having an appropriate beam shape similar to the light beam A through the beam forming optical system 251B, is reflected from the PBS 270, is brought into close to the light beam A, and has a parallel light path. Thereafter, the light beam B passes through a ½ wavelength plate portion 2711 of the combination wavelength plate 271, is converted from S polarized light to P polarized light, passes through the polarizer 272, and is condensed on the sample 101 by the condenser lens 255 to light up.

Thereby, it is possible to emit two light beams (light beam A, light beam B) having substantially the same wavelength and substantially the same polarization onto the sample 101 from substantially the same incidence direction. Here, the wording "substantially the same wavelength" as used herein means that a difference in wavelength between the two light beams (light beam A, light beam B) is within ±1% of an average wavelength at most. In addition, the wording "substantially the same polarization" as used herein means that a range between the polarization axes of the two light beams (light beam A, light beam B) is within ±10 degrees, preferably, equal to or less than ±4 degrees. In addition, an extinction ratio is 50:1, preferably, 100:1. Here, the direction of the polarization axis is the center of a polarization direction of the entire luminous flux, and the extinction ratio indicates a variation in the polarization direction in the luminous flux.

The setting of the difference in wavelength between the two light beams (light beam A, light beam B) and the range between the polarization axes thereof to the above-mentioned numerical ranges is significant in order to maintain effects of the pupil filters. Specifically, the pupil filters have an effect of removing scattered light (noise) from the sample 101, transmits scattered light from fine foreign substances or a defect, and improves an S/N ratio to make a signal from the foreign substances or the defect obvious.

Light having a low extinction ratio is light in which P polarized light and S polarized light are mixed with each other. The scattered light from the sample or the defect changes depending on a polarization direction of illumination. For this reason, the pupil filters are designed in accordance with illumination polarization. For example, in a pupil filter designed for P polarized light, it is not possible to remove scattered light (noise) from the sample which is generated due to an S polarized light component of illumination.

The ½ wavelength plate 273 may not be provided. In this case, the light source 250B is mounted so as to be rotated by 90 degrees with respect to the light source 250A, and thus emits S polarized light. There is an advantage in that the number of components can be reduced. However, in a case where there is a longitudinal and lateral difference in the quality of light beams emitted by the light source, the light sources 250A and 250B may be mounted in the same direction as illustrated in FIG. 4, the ½ wavelength plate may be used to rotate the polarization direction of light beams of one of the light sources by 90 degrees. For example, in a case of an LD laser, the quality of a beam in a direction in which a voltage is applied is different from that in a direction perpendicular thereto in terms of the structure of an LD element. Since the installation orientations of the light source 250A and the light source 250B can be aligned with each other by using the ½ wavelength plate 273, it is possible to reduce a difference in the quality of a beam between light beams.

In a case where an interval between the light beam A and the light beam B behind the PBS 270 is sufficiently large and the light beams do not overlap each other, the polarizer 272 may not be provided. In a case where the light beam A and the light beam B are brought into close to each other by the PBS 270, there is a possibility that the light beams pass through an originally unintended region by the combination wavelength plate 271. In this case, the light beams have a polarization component perpendicular to the irradiation polarization direction, and thus the purity of the illumination polarization is reduced, which results in the deterioration of detection sensitivity. Consequently, the purity of the illumination polarization is maintained by removing the polarization component perpendicular to the illumination polarization by the polarizer 272. A PBS having a high extinction ratio and transmittance may be used instead of the polarizer 272. In this case, the extinction ratio is preferably equal to or higher than 100:1.

In FIG. 4, a description has been given of a case where the light sources 250A and 250B emit P polarized light, but the light sources 250A and 250B may emit S polarized light. In this case, the ½ wavelength plate 273 is disposed on the axis of the light beam A on the PBS 270 from the light source 250A, and the ½ wavelength plate 273 on the light beam B is removed.

In FIG. 4, the light beam A and the light beam B are brought into close to each other to be made parallel to each other behind the beam forming optical systems 251A and 251B, but the invention is not limited thereto. For example, the PBS 270 may be disposed between the light source and the beam forming optical system or within the beam forming optical system, and the two light beams may be brought into close to each other to be made parallel to each other. In this case, the entirety or a portion of the beam forming optical system can be shared, and thus it is possible to reduce the number of components. However, the optical axes of the two light beams are not coaxial with each other, and thus the size of an optical component which is a portion which is common to the two light beams is increased. In addition, the beam forming optical system is common, and thus it becomes difficult to absorb a machine difference between the two light sources by adjustment. In a case of a lens having a large curvature, there is a disadvantage in that the influence of lens aberration such as spherical aberration is also increased. In a case where only the condenser lens is shared as illustrated in FIG. 4, separate beam forming optical systems are provided, and thus it is easy to absorb mechanism between the light sources. On the other hand, the number of common components is small, and thus there are disadvantages in the number of components and the capacity of the device. In any case, the two light beams incident on the condenser lens have optical axes parallel to each other.

In addition to the configuration of FIG. 4, light beams may be appropriately folded by a mirror in order to make the device compact. In addition, a mechanism that exchanges a portion of a lens constituting one beam forming optical system for another lens having a different focal length may be provided to change the illumination spot size on the sample 101. The switching of the lens is controlled by the control system 125.

The control system 125 reads defect information which is output by the defect inspection device 107 or defect information stored in the storage device 124, and controls the stage 103 so that a defect to be observed enters a visual field of the optical microscope 105 on the basis of the read defect information. A defect coordinate deviation between the defect inspection device 107 and the review device 100 is calculated on the basis of an image detected by the optical microscope 105, and defect coordinate information stored in the storage device 124 is corrected.

The SEM 106 includes an electron beam irradiation system including an electron beam source 151, an extraction electrode 152, a deflection electrode 153, and an objective lens electrode 154, and an electron detection system including a secondary electron detector 155 and a reflected electron detector 156. Primary electrons are discharged from the electron beam source 151 of the SEM 106, and the discharged primary electrons are extracted in the form of beams by the extraction electrode 152 and are accelerated. The orbit of the primary electron beams accelerated by the deflection electrode 153 is controlled in the X-direction and the Y-direction, and the primary electron beams of which the orbit is controlled converge on the surface of the sample 101 by the objective lens electrode 154 so that the surface of the sample is irradiated and scanned with the primary electron beams. Secondary electrons, reflected electrons, and the like are generated from the surface of the sample 101 irradiated and scanned with the primary electron beams.

The secondary electron detector 155 detects the generated secondary electrons, and the reflected electron detector 156 detects relatively high-energy electrons such as reflected electrons. A shutter (not shown) disposed on the optical axis of the SEM 106 selects the start or stop of irradiation of the sample 101 with the electron beams emitted from the electron beam source 151.

Measurement conditions of the SEM 106 are controlled by the control system unit 125, and it is possible to change an acceleration voltage, the focusing of electron beams, and an observation magnification. The SEM 106 observes a defect in detail on the basis of the defect coordinate information corrected using the image captured by the optical microscope 105. Here, a general flow of the observation of a defect is disclosed in JP-A-2011-106974 described above, and thus a description thereof will not be repeated.

In the plurality of light sources described in this embodiment, in a case where a portion of light sources is stopped due to a lifespan, failure, or the like, the inspection itself can be continued using the remaining normal light sources, and there is an advantage in that it is possible to suppress the deterioration of an operation rate of the device.

Second Embodiment

Figure 5:
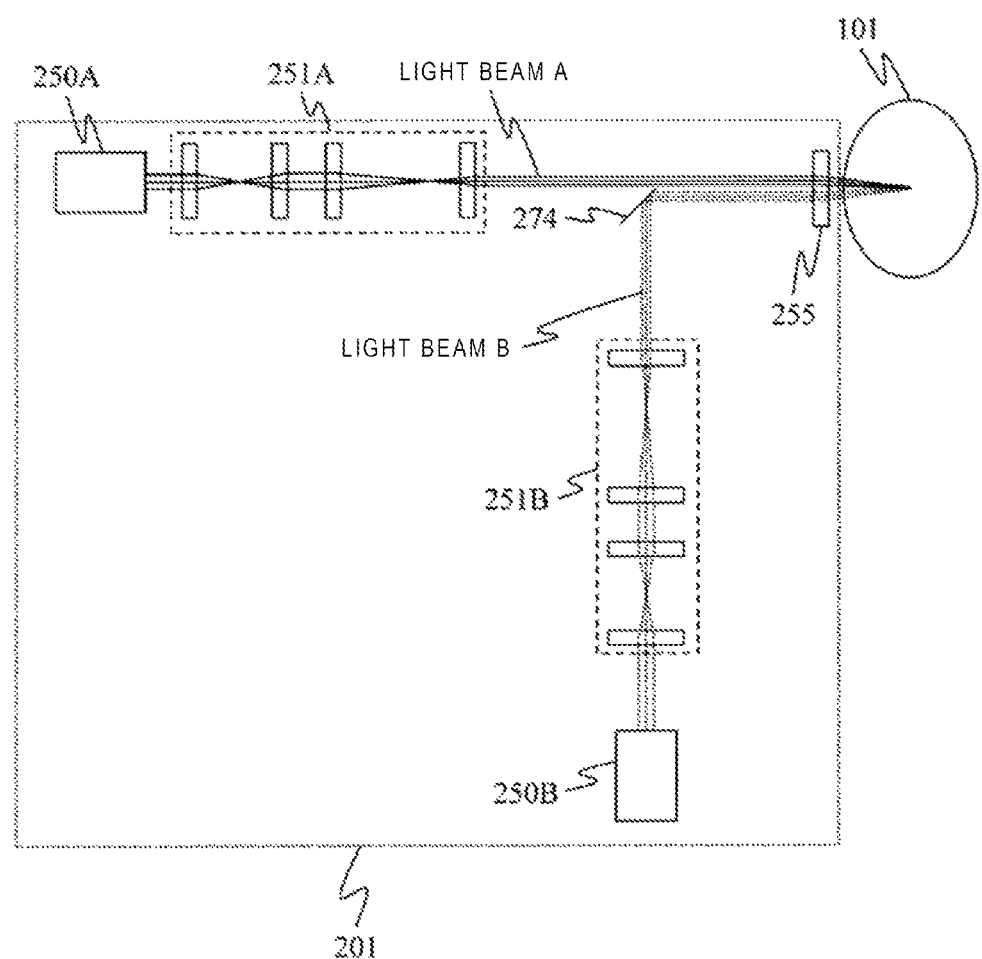
FIG. 5 is a schematic diagram illustrating an illumination system of an optical microscope unit in a second embodiment of the invention.

Next, a second embodiment of the invention will be described with reference to FIG. 5. FIG. 5 is a diagram illustrating an illumination system of an optical microscope unit in the second embodiment. A configuration of a review device in this embodiment is the same as those in FIGS. 1 to 3H, and thus a description thereof will not be repeated.

In this embodiment, means for bringing two light beams into close to each other and making light paths thereof have optical axes parallel to each other is different from that in the first embodiment. Light sources 250A and 250B are mounted in the same direction. P polarized light emitted from the light source 250A is converted into parallel light having an appropriate beam shape by a beam forming optical system 251A. On the other hand, a light beam B of P polarized light emitted from the light source 250B is converted into parallel light having an appropriate beam shape by a beam forming optical system 251B. The light path of the light beam B is bent by a mirror 274 so that the light beam B is brought into close to a light beam A and has an optical axis parallel to that of the light beam A.

In FIG. 5, a description has been given of a case where light beams of P polarized light are emitted from the light sources 250A and 250B, and a sample 101 is irradiated with P polarized light, but the invention is not limited thereto. In addition, the mirror 274 may be disposed between the light sources and the beam forming optical systems or within the beam forming optical system so that a portion of the optical system is shared by the light beam A and the light beam B and the number of components and the capacity of the device are reduced. However, in a case where there is a great machine difference between the light sources 250A and 250B, the mirror 274 may be disposed behind the beam forming optical system as illustrated in FIG. 5, and the machine difference between the light sources may be absorbed in each of the beam forming optical systems.

Third Embodiment

Figure 6:
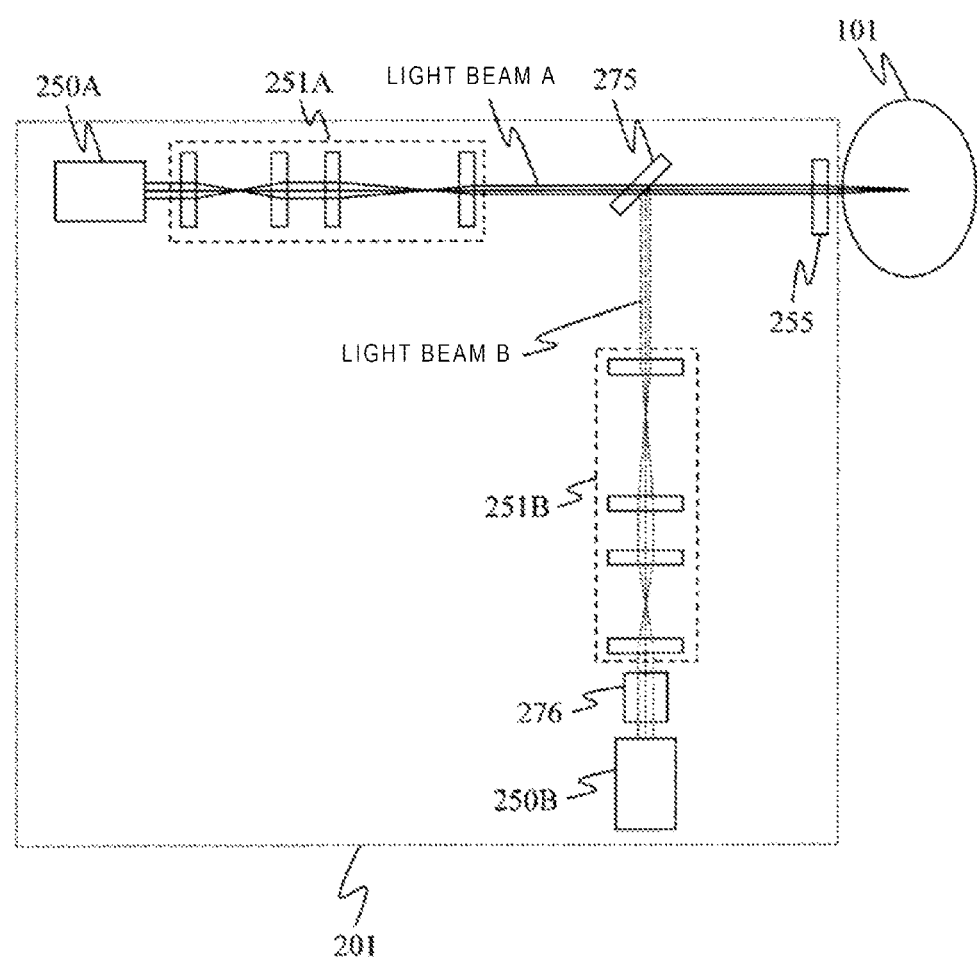
FIG. 6 is a schematic diagram illustrating an illumination system of an optical microscope unit in a third embodiment of the invention.

Next, a third embodiment of the invention will be described with reference to FIG. 6. FIG. 6 is a diagram illustrating illumination light of an optical microscope unit in the third embodiment. A configuration of a review device in this embodiment is the same as those in FIGS. 1 to 3H, and thus a description thereof will not be repeated.

In this embodiment, means for bringing two light beams into close to each other and making light paths thereof have optical axes parallel to each other is different from that in the first embodiment. A light beam A of linearly polarized light emitted from a light source 250A passes through a beam forming optical system 251A, a dichroic mirror 275, and a condenser lens 255, and is condensed and emitted onto a sample 101. On the other hand, the wavelength of a light beam B emitted from a light source 250B emitting light having the same wavelength and polarization direction as those of the light source 250A is shifted by an AO (acoustic optical element) frequency shifter 276 by an extremely small amount. The dichroic mirror 275 is designed to transmit the light beam A and reflect the light beam B of which the wavelength has been modulated, and thus it is possible to make the light beam A and the light beam B, having substantially the same wavelength and substantially the same polarization, approach and parallel to each other.

Similarly to the first embodiment described above, a pupil filter of a detection optical system has dependence on a wavelength, and thus a difference in wavelength between the light beam A and the light beam B may be within ±1% of the wavelength. In this embodiment, a case where the light beam B modulated by the AO frequency shifter 276 is reflected by the dichroic mirror 275 has been described, or vice versa. In a case where a variation in the wavelength of the light source is large, and reflection and transmission by the dichroic mirror 275 can be selected by selecting the light source, the light sources 250A and 250B having wavelengths respectively suitable for the light beam A and the light beam B may be selected and used without using the AO frequency shifter 276.

Fourth Embodiment

Next, a fourth embodiment of the invention will be described with reference to FIGS. 7 and 8.

In the first to third embodiments described above, a method of illuminating a sample 101 using two light beams has been described. However, the number of light beams to be emitted is not limited to two, and three or more light beams may be emitted. FIGS. 7 and 8 are diagrams illustrating illumination light of an optical microscope unit in the fourth embodiment using three light beams. A configuration of a review device in this embodiment is the same as those in FIGS. 1 to 3H, and thus a description thereof will not be repeated.

Figure 7:
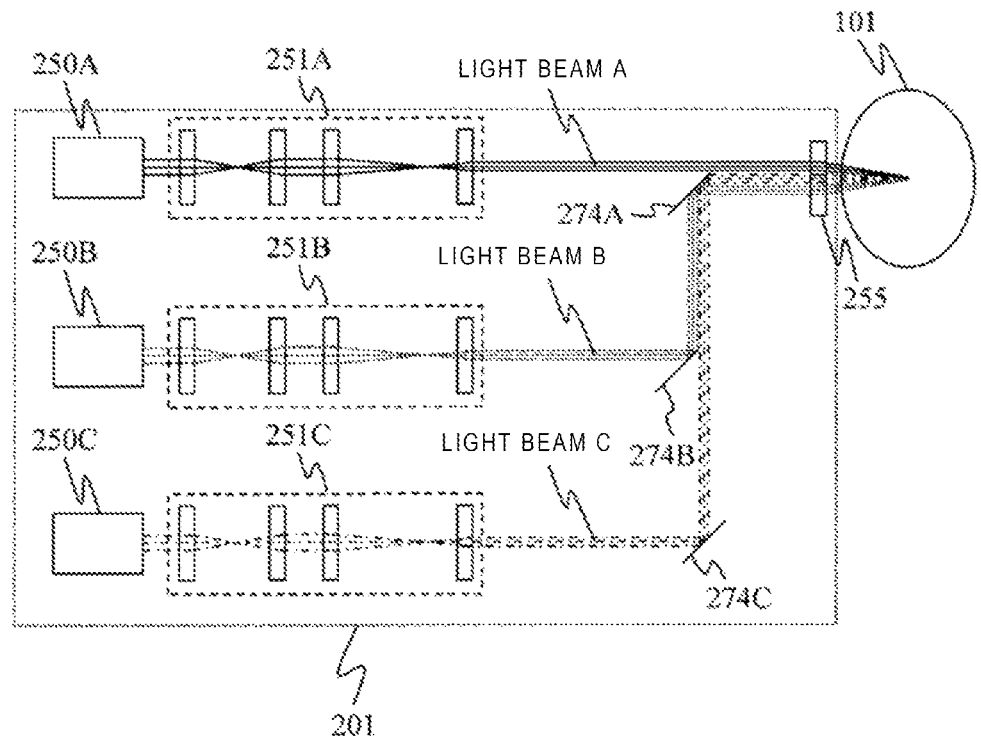
FIG. 7 is a schematic diagram illustrating an illumination system of an optical microscope unit in a fourth embodiment of the invention.

In FIG. 7, means for bringing a plurality of light beams into close to each other and making light paths thereof have optical axes parallel to each other is a mirror 274, similar to the second embodiment described above. In addition, FIG. 8 illustrates a PBS 270 and a combination wavelength plate 271, similar to the first embodiment described above. At this time, a plurality of light beams are incident on the optical axis of a condenser lens 255 so that a difference between incidence directions of light beams emitted onto a sample 101 is minimized. For example, in a case where a plurality of light beams are emitted onto the sample 101 at the same incident angle, the arrangement is performed such that the optical axes of the plurality of light beams are parallel and laterally symmetrical to the optical axis of the condenser lens 255.

Figure 8:
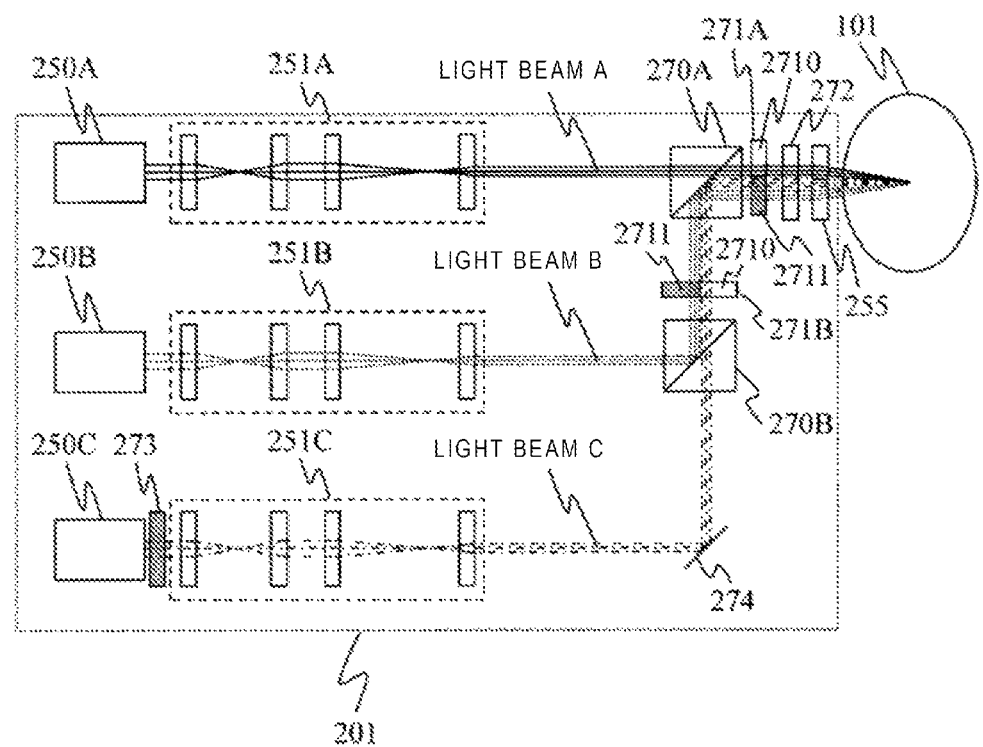
FIG. 8 is a schematic diagram illustrating the illumination system of the optical microscope unit in the fourth embodiment of the invention.

In a case where the number of light beams is an odd number, the optical axis of one light beam is set to be coaxial with the optical axis of the condenser lens 255, and the even number of remaining light beams are disposed so as to be laterally symmetrical to the optical axis of the condenser lens 255 (see FIGS. 7 and 8). At this time, the shapes of beams of light beams behind a beam forming optical system may be different from each other in order to obtain the same illumination spot size on the sample 101 in accordance with respective incidence directions. In addition, since a difference between the incidence directions is small, all of the shapes of beams of light beams behind the beam forming optical system may be the same as each other.

In addition, the mirror 274 is used in FIG. 7 and the PBS 270 and the combination wavelength plate 271 are used in FIG. 8. However, means for bringing a plurality of light beams into close to each other and making light paths thereof have optical axes parallel to each other is not limited thereto and may be a dichroic mirror, and the means may be realized by a combination thereof (not shown). In a case where the dichroic mirror is used, the optical axes of the respective light beams may be set to be coaxial with the optical axis of the condenser lens 255. A PBS may be used instead of a polarizer 272.

Fifth Embodiment

Next, a fifth embodiment of the invention will be described. In the first to fourth embodiments described above, a configuration including a plurality of light beams obtained from a plurality of light sources has been described. The light sources of the first to fourth embodiments are, for example, single-mode lasers with high-quality beams.

In the fifth embodiment, a configuration including a plurality of light beams obtained by dividing a light beam emitted from a single light source will be described. A light source in the fifth embodiment has poor beam quality to be used as it is, and a light source having problems such as a low purity in a polarization direction and illumination unevenness is assumed. For example, the light source is a multi-mode laser light source, an LD module having a plurality of LD elements disposed therein, or a fiber bundle type LD module. There are many multi-mode lasers with power higher than that of a single mode laser, but it is difficult to use the multi-mode lasers for illumination due to poor beam quality and a problem such as illumination unevenness during light condensing.

On the other hand, a light beam is divided and the separate light beams are superimposed on each other again with a light path equal to or longer than a coherent distance, which is sufficiently long, therebetween, and thus coherence between the separate light beams is lost, which leads to a reduction in illumination unevenness by an averaging effect. This is because the illumination unevenness is caused by interference within the same light beam. Thereby, it is possible to use a multi-mode high power laser, having not been used in the related art, as an illumination light source 250 of an optical microscope. There is an advantage in that the capacity of the device can be reduced when a light source having a short coherent distance is used. For example, a multi-mode LD is used as the light source.

Figure 9:
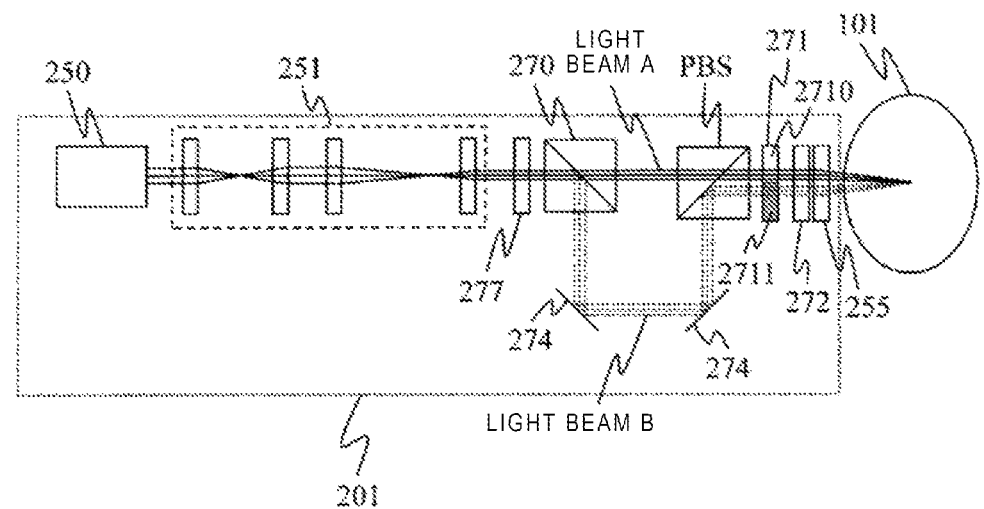
FIG. 9 is a schematic diagram illustrating an illumination system of an optical microscope unit in a fifth embodiment of the invention.

A case where a high power multi-mode laser is used as the light source 250 will be described with reference to FIG. 9. A light beam of linearly polarized light emitted from the light source 250 is converted into circularly polarized light by a ¼ wavelength plate 277 by forming the diameter of the light beam by a beam forming optical system 251, a P polarized light component is transmitted by a PBS 270, and an S polarized light component is reflected. Thereby, the light beam is divided into two light beams of a light beam A and a light beam B. The two separate light beams having different polarization directions are brought into close to each other and are made to have light paths with optical axes parallel to each other by using the PBS 270 and a combination wavelength plate 271, similar to the first embodiment. Means for bringing the two light beams into close to each other and making light paths thereof have optical axes parallel to each other may be the mirror 274 in the second embodiment or the dichroic mirror 275 in the third embodiment. In a case where the mirror 274 or the dichroic mirror 275 is used, it is necessary to put a ½ wavelength plate into either the light beam A or the light beam B to arrange the polarization directions of the two light beams. In addition, in a case where the dichroic mirror 275 is used, an AO frequency shifter is also required to modulate the wavelength of any one light beam as illustrated in FIG. 11.

Figure 10:
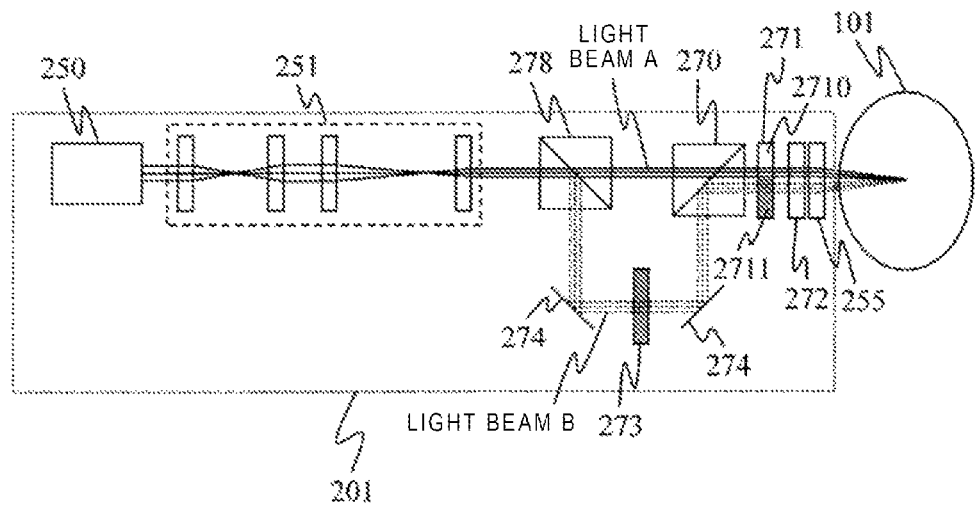
FIG. 10 is a schematic diagram illustrating the illumination system of the optical microscope unit in the fifth embodiment of the invention.

In addition, a light beam may be divided into two light beams by a half mirror 278 as illustrated in FIG. 10, without using the ¼ wavelength plate 277. At this time, the same means as those in the first to third embodiments described above may be used as means for bringing two light beams into close to each other and making light paths thereof have optical axes parallel to each other. FIG. 10 illustrates a method using a ½ wavelength plate 273, the PBS 270, and the combination wavelength plate 271, similar to the first embodiment described above. Here, a PBS may be used instead of a polarizer 272. In FIGS. 9 and 10, a light beam is divided after passing through the beam forming optical system 251. However, the invention is not limited thereto, and the light beam may be divided between the light source 250 and the beam forming optical system 251 or inside the beam forming optical system 251.

Figure 11:
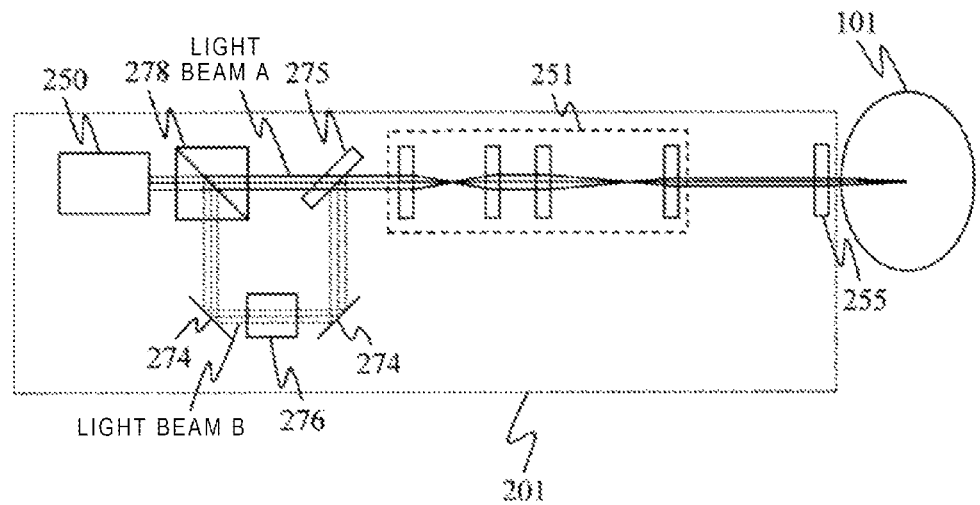
FIG. 11 is a schematic diagram illustrating the illumination system of the optical microscope unit in the fifth embodiment of the invention.

In a case where the dichroic mirror 275 is used as illustrated in FIG. 11, two separate light beams can be made coaxial with each other by the dichroic mirror. For this reason, when a light beam is divided right behind the light source 250 and the two separate light beams are made coaxial with each other in front of the beam forming optical system 251, there is an advantage in that it is possible to reduce the size of an optical component and to reduce the number of components. In FIG. 11, the half mirror 278 is used to divide a light beam, but the division may be performed using the ¼ wavelength plate 277 and the PBS 270 as illustrated in FIG. 9.

Sixth Embodiment

Next, a sixth embodiment of the invention will be described with reference to FIG. 12. A configuration of a review device in the sixth embodiment is the same as those in FIGS. 1 to 3H, and thus a description thereof will not be repeated. In the fifth embodiment described above, a configuration including two light beams obtained by dividing a light beam emitted from a single light source into two light beams has been described. However, in this embodiment, a configuration including a plurality of light beams obtained by dividing a light beam emitted from a single light source into three or more light beams will be described.

Regarding the effect of averaging, described in the fifth embodiment, which is obtained by superimposing a plurality of light beams on each other, an effect of reducing illumination unevenness becomes greater as the number of light beams to be superimposed on each other increases. On the other hand, since individual light beams are not coaxial with each other on a condenser lens 255, an interval between the optical axis of the condenser lens 255 and the farthest light beam becomes larger as the number of light beams obtained by division increases, which leads to the necessity of a large-sized condenser lens 255. In addition, the influence of aberration of the condenser lens 255 is increased. In particular, in a case where the focal length of the condenser lens 255 is short, the influence of aberration is further increased. In a case where the focal length of the condenser lens 255 is sufficiently long, the influence of aberration can be reduced, but the length of a light path of an illumination optical system is extended, thereby maximizing the capacity thereof.

Figure 12:
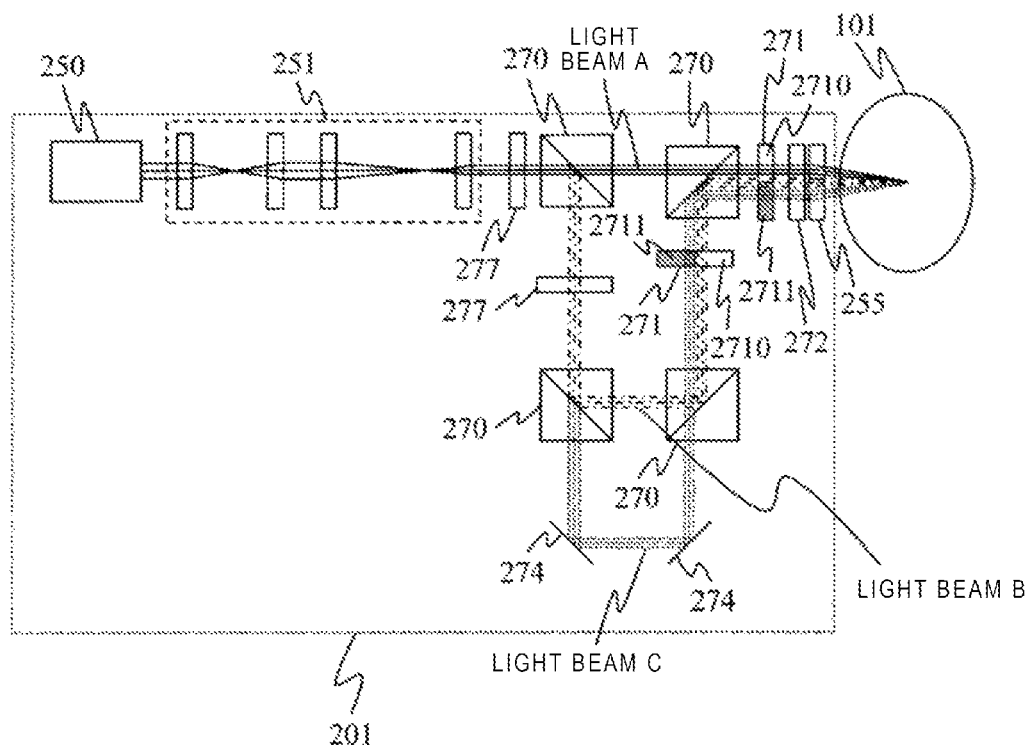
FIG. 12 is a schematic diagram illustrating an illumination system of an optical microscope unit in a sixth embodiment of the invention.

FIG. 12 illustrates an illumination system in which a single light source 250 of linearly polarized light is divided into three light beams by a ¼ wavelength plate 277 and a PBS 270, and the PBS 270 and a combination wavelength plate 271 are used. The separate three light beams are brought into close to each other and are made to have light paths with optical axes parallel to each other, and are emitted onto the same region of a sample 101 by the condenser lens 255 with the same wavelength and the same polarization and in substantially the same incidence direction.

A method of dividing a light beam does not depend on FIG. 12, and a half mirror may be used as described in the fifth embodiment. In a case where a light source of non-polarized light is used as the light source 250, a light beam can also be divided by only the PBS 270 without using the ¼ wavelength plate 277.

In addition, as described in the fourth embodiment, also in this embodiment, a plurality of light beams are incident on the optical axis of the condenser lens 255 so as to minimize a difference in incidence direction between light beams emitted onto the sample 101. For example, in a case where a plurality of light beams are emitted onto the sample 101 at the same incident angle, the arrangement is performed such that the optical axes of the plurality of light beams are parallel and laterally symmetrical to the optical axis of the condenser lens 255. In addition, in a case where the number of light beams is an odd number, the optical axis of one light beam is set to be coaxial with the optical axis of the condenser lens 255, and the even number of remaining light beams are disposed so as to be laterally symmetrical to the optical axis of the condenser lens 255. At this time, the shapes of beams of light beams behind a beam forming optical system may be different from each other in order to obtain the same illumination spot size on the sample 101 in accordance with respective incidence directions. In addition, since a difference between the incidence directions is small, all of the shapes of beams of light beams behind the beam forming optical system may be the same as each other.

In FIG. 12, the PBS 270 and the combination wavelength plate 271 are used as means for bringing a plurality of light beams into close to each other and making light paths thereof have optical axes parallel to each other. However, the invention is not limited thereto, and a mirror as in the second embodiment or a dichroic mirror as in the third embodiment may be used, or the means may be realized by a combination thereof (not shown). In a case where the dichroic mirror is used, the optical axes of the respective light beams may be set to be coaxial with the optical axis of the condenser lens 255. In FIG. 12, the purity of illumination in a polarization direction is increased using a polarizer 272, but a PBS may be used instead of the polarizer 272. In a case where the mirror as in the second embodiment or the dichroic mirror as in the third embodiment is used, the polarizer 272 may not be provided.

Seventh Embodiment

Next, a seventh embodiment of the invention will be described with reference to FIG. 13. In the seventh embodiment, a light source of non-polarized light is used as a light source 250. A configuration of a review device in this embodiment is the same as those in FIGS. 1 to 3H, and thus a description thereof will not be repeated.

This embodiment is different from the fifth embodiment in that a light source of non-polarized light is used as the light source 250. Examples of the light source of non-polarized light include a fiber bundle type LD module, an LD slot module, and the like. In this embodiment, the light source 250 is a light source of non-polarized light, and thus it is possible to divide a light beam as it is by a PBS 270 without using a ¼ wavelength plate 277. Means for bringing a plurality of separate light beams into close to each other and making the light beams have optical axes parallel to each other is the same as those in the first to sixth embodiments, and thus a description thereof will not be repeated.

Figure 13:
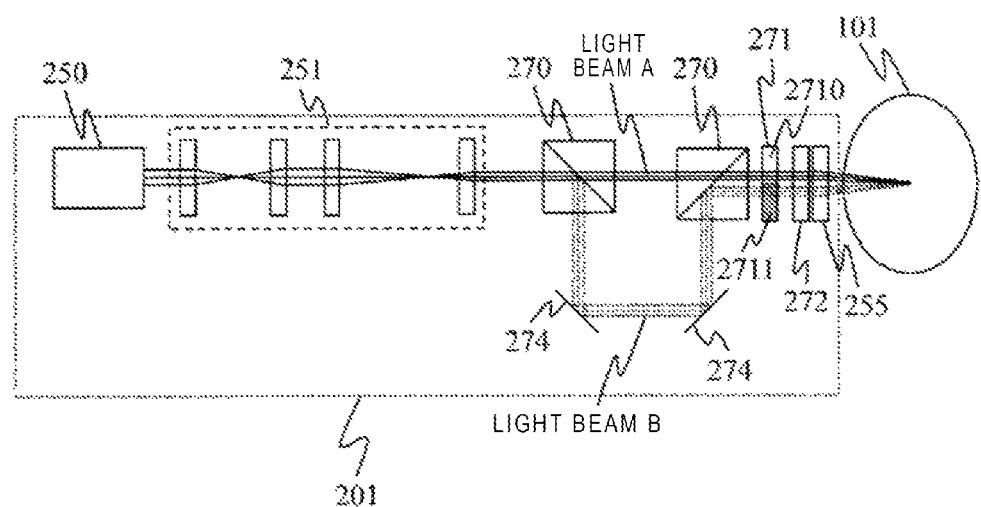
FIG. 13 is a schematic diagram illustrating an illumination system of an optical microscope unit in a seventh embodiment of the invention.

In FIG. 13, a plurality of light beams are arranged by the PBS 270 and a combination wavelength plate 271, but the invention is not limited thereto. After non-polarized light emitted from the light source 250 is divided by the PBS 270, the wavelength of one light beam may be shifted by an AO frequency shifter, and a plurality of separate light beams may be arranged on the same axis by a dichroic mirror. In addition, the number of light beams obtained by the division is not limited to two as in the sixth embodiment described above, and the light beam may be divided into a plurality of light beams of three or more light beams.

As described above, the invention carried out by the inventor has been described on the basis of the embodiments. However, the invention is not limited to the above-described embodiments, and various modifications can be made without departing from the scope.

What is claimed is:

1. A defect detection device comprising:
an illumination system that includes
a condenser lens; and
a plurality of laser light beam sources each including a beam forming system; and
a combination wavelength plate having a fractional wavelength portion and a dummy portion,
wherein the condenser lens condenses a plurality of light beams which are emitted onto a sample and have substantially a same wavelength and substantially a same polarization direction on the sample,
wherein the plurality of beam forming systems brings the plurality of light beams closer to each other and causes the light beams to have light paths parallel to an optical axis of the condenser lens, and
wherein the combination wavelength plate is arranged so that a first of said plurality of light beams passes through the dummy portion, and a second of said plurality of light beams passes through the fractional wavelength portion and is converted to said substantially same polarization direction; and
a detector that detects scattered light generated on the sample by the illumination system.

2. The defect detection device according to claim 1, wherein the detector includes a filter, having dependence on a wavelength and polarized light, on a pupil surface.

3. The defect detection device according to claim 1, wherein each of the plurality of light beam sources further comprises a polarized beam splitter.

4. The defect detection device according to claim 1, wherein a polarizer or a polarized beam splitter, which is set to have an extinction ratio equal to or higher than 100:1 of polarization directions of the plurality of light beams, is disposed between the plurality of light beam sources and the condenser lens.

5. The defect detection device according to claim 3, wherein the plurality of light beam sources are mounted in a direction in which light beams in the same polarization direction are emitted, and polarization directions of light beams emitted from some of the plurality of light beam sources are rotated by 90 degrees by a ½ wavelength plate.

6. The defect detection device according to claim 1, wherein the plurality of light beams are parallel and laterally symmetrically incident on the optical axis of the condenser lens.

7. The defect detection device according to claim 1, wherein a difference in wavelength between the plurality of light beams is within ±1% of an average wavelength at most, and a range between polarization axes of the plurality of light beams is within ±10 degrees.

8. A defect observation device comprising:
a defect detection device comprising
an illumination system that includes
a condenser lens;
a plurality of laser light beam sources each including a beam forming system; and
a combination wavelength plate having a fractional wavelength portion and a dummy portion,
wherein the condenser lens condenses a plurality of light beams which are emitted onto a sample and have substantially a same wavelength and substantially a same polarization direction on the sample,
wherein the plurality of beam forming systems brings the plurality of light beams closer to each other and causes the light beams to have light paths parallel to an optical axis of the condenser lens, and
wherein the combination wavelength plate is arranged so that a first of said plurality of light beams passes through the dummy portion, and a second of said plurality of light beams passes through the fractional wavelength portion and is converted to said substantially same polarization direction; and
a detector that detects scattered light generated on the sample by the illumination system; and
a control system that acquires an image based on scattered light detected by the detection unit of the defect detection device and calculates coordinates of a defect on the basis of the acquired image, wherein the illumination system of the defect detection device is disposed outside a pupil of the detector.

* * * * *